(12) United States Patent
Ramachandran et al.

(10) Patent No.: US 6,897,131 B2
(45) Date of Patent: May 24, 2005

(54) ADVANCES IN SPIKE ANNEAL PROCESSES FOR ULTRA SHALLOW JUNCTIONS

(75) Inventors: Balasubramanian Ramachandran, Santa Clara, CA (US); Ravi Jallepally, Santa Clara, CA (US); Ryan C. Boas, Watertown, MA (US); Sundar Ramamurthy, Fremont, CA (US); Amir Al-Bayati, San Jose, CA (US); Houda Graoui, Santa Clara, CA (US); Joseph M. Spear, Portland, OR (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/668,682

(22) Filed: Sep. 22, 2003

(65) Prior Publication Data

US 2004/0126999 A1 Jul. 1, 2004

Related U.S. Application Data

(60) Provisional application No. 60/412,449, filed on Sep. 20, 2002.

(51) Int. Cl.[7] .............................................. H01L 21/425
(52) U.S. Cl. ..................... 438/530; 438/301; 438/795
(58) Field of Search .................................. 438/510–530, 438/795–799, 299–308

(56) References Cited

U.S. PATENT DOCUMENTS

| | | | |
|---|---|---|---|
| 5,155,336 A | 10/1992 | Gronet et al. ................ 219/411 |
| 5,206,871 A | 4/1993 | Deppe et al. .................. 372/45 |
| 5,635,409 A * | 6/1997 | Moslehi .......................... 438/7 |
| 5,660,472 A | 8/1997 | Peuse et al. ................. 374/128 |
| 5,716,133 A | 2/1998 | Hosokawa et al. .......... 374/121 |
| 5,993,059 A | 11/1999 | O'Neill et al. .............. 374/126 |
| 6,007,241 A | 12/1999 | Yam et al. ................... 374/131 |
| 6,087,247 A | 7/2000 | Downey ....................... 438/530 |
| 6,100,149 A | 8/2000 | Nenyei et al. ............... 438/308 |
| 6,124,912 A | 9/2000 | Moore .......................... 349/113 |
| 6,127,658 A | 10/2000 | Kohav .......................... 219/390 |
| 6,142,663 A | 11/2000 | Takasuka ..................... 374/121 |
| 6,160,242 A | 12/2000 | Guardado ..................... 219/390 |
| 6,174,080 B1 | 1/2001 | Jennings ...................... 374/131 |
| 6,183,130 B1 | 2/2001 | Adams et al. ............... 374/131 |
| 6,214,682 B1 | 4/2001 | Wang ........................... 438/301 |
| 6,215,106 B1 | 4/2001 | Boas et al. .................. 219/390 |
| 6,362,081 B1 * | 3/2002 | Chuang ........................ 438/522 |
| 6,503,846 B1 * | 1/2003 | Niimi et al. ................. 438/776 |

(Continued)

OTHER PUBLICATIONS

Murrell et al, "Doping accuracy requirements of USJ processes for advanced sub–100 nm CMOS devices" Extended abstarcts of internation workshop on junction technology 2002, pp 9–14.*

Sun et al, "Spike Anneal Qualification fro 0.13 micro meters USJ Technology on Radiance Center" 9th international conference on Advanced Thermal processing of Semiconductors–RTP 2001, pp 246–249.*

Fiory et al, "Shallow Boron Implant Activation" Mat. Res. Soc.Symp.Proc. vol.5681999 Materilas Research Sociiety. pp31–36.*

*Primary Examiner*—Savitri Mulpuri
(74) *Attorney, Agent, or Firm*—Moser, Patterson & Sheridan, LLP

(57) ABSTRACT

Lamp based spike annealing was improved to address the aggressive requirements of <100 nm Ultra Shallow Junction (USJ) technologies. Improvements focused on enhancing cool down rates, and thereby improving spike sharpness. Boron ion implanted substrates with varying ion-implanted energy and dose were then annealed to characterize the improvements in spike annealing. A greater than 10% improvement in sheet resistance and junction depth was realized on substrates that were annealed with the improved spike profile. The improved spike anneal had the same comparable uniformity to the standard spike anneal.

12 Claims, 4 Drawing Sheets

U.S. PATENT DOCUMENTS

| | | | |
|---|---|---|---|
| 6,624,095 B1 * | 9/2003 | Yamamoto | 438/795 |
| 6,770,500 B2 * | 8/2004 | Callegari et al. | 438/38 |
| 6,803,297 B2 * | 10/2004 | Jennings et al. | 438/530 |
| 6,828,234 B2 * | 12/2004 | Tam et al. | 438/663 |
| 6,835,626 B2 * | 12/2004 | Chu et al. | 438/301 |
| 2001/0041432 A1 * | 11/2001 | Lee | 438/530 |
| 2002/0162500 A1 * | 11/2002 | Hong et al. | 117/3 |

* cited by examiner

ADVANCES IN SPIKE ANNEAL PROCESSES FOR ULTRA SHALLOW JUNCTIONS

CROSS-REFERENCE TO RELATED APPLICATIONS

This application claims benefit of U.S. provisional patent application Ser. No. 60/412,449, filed Sep. 20, 2002, which is herein incorporated by reference. This application is also related to U.S. patent applications Ser. Nos. 10/251,440 [6113], filed Sep. 20, 2002, and Ser. No. 10/267,053 [6519], filed Oct. 7, 2002 [6519]. Each of the aforementioned related patent applications is incorporated by reference herein.

BACKGROUND OF THE INVENTION

1. Field of the Invention

This application relates to semiconductor processing technologies, and particularly to a method of annealing semiconductor substrates with rapid thermal processing.

2. Description of the Related Art

In today's high speed semiconductor devices, ultra-shallow junctions, low sheet resistance and abrupt lateral junctions are vital to reduce short channel effects and to increase transistor saturation current in source drain extensions. Several techniques have been developed to deal with the issues associated with the formation of shallow, low sheet resistance junctions. Examples of these issues are transient enhanced diffusion (TED), solid solubility, and channeling, which can be resolved by using low energy implants and sharp spike anneals. During low energy implant processes, the implant energies are limited to about 1 keV or less. Thus, TED is minimized because defects caused by the implant processes are confined close to the surface. Sharp spike anneals following the implant processes provide high dopant activation and effective implant damage removal while minimizing dopant diffusion.

Spike anneal is typically performed by subjecting a semiconductor substrate having implanted dopants to temperature treatment in a rapid thermal processing (RTP) system. A typical annealing profile using RTP involves ramping up to a target temperature, e.g. 1050° C., soaking the substrate at the target temperature for a period of time (soak time), and ramping down to a base temperature, e.g. 200° C. For spike anneal, high ramp rates, e.g., 75° C./sec or higher, and short (~1 sec) or no soak time are desired to prevent excessive dopant diffusion. Besides the tight temperature control requirement, gas composition in the annealing ambient may also need to be controlled. For example, the presence of oxygen has been found to be necessary in order to decrease the evaporation or out-diffusion of implanted dopants such as boron and arsenic, but too much oxygen in the annealing ambient results in oxygen enhanced diffusion (OED) and limits the creation of shallow junctions, particularly when dopants such as boron are used.

Continued demand for smaller, more compact, faster, and more powerful chips forces the device geometries to scale down to and beyond the 100 nm node. Such aggressive downscaling in device geometries increase the Short Channel Effects (SCE). This reduces the differentiation between $I_{on}$ ($I_{dsat}$) (on state device current which is dependent on device type) and $I_{off}$ (off state device current or leakage currents), which reduction is essential for maintaining the device functionality. Thus the critical challenge in scaling device geometries is to maintain a distinction between $I_{on}$ ($I_{dsat}$) and $I_{off}$.

A key to the challenge in scaling device geometries is in process/performance improvements in Ultra-Shallow Junction (USJ) technology. In a device, $I_{on}$ ($I_{dsat}$) depends on the amount of active dopant material within the device. Sheet resistance ($R^s$—as measured by a standard four-point probe method) is one way to measure activation. Higher activation typically provides lower sheet resistance. On the other hand, $I_{off}$ is dependent on the amount of dopant material that is diffused through the junction. Junction depth is measured as the depth in Angstroms (Å) at which the concentration of the measured species reaches a concentration of $10^{18}$ atoms/$cm^3$, as measured by HRD (Dynamic) SIMS (Secondary Ion Mass Spectroscopy) profiles. As junction depth increases, $I_{off}$ increases. Thus, maintaining the differentiation between $I_{on}$ and $I_{off}$ for USJ technology requires a smaller leakage (reduced junction depth) for the same or increased activation (reduced sheet resistance). The sheet resistance and junction depth ($X_j$) requirements for varying technology nodes are outlined in the International Technology Roadmap for Semiconductors (ITRS), 1999 & 2001 Edition, SIA, San Jose.

Current USJ technology involves ion implantation followed by a rapid thermal spike annealing process. The main parameters in any spike annealing process are the peak temperature ($T_P$), and residence time ($t_R$). A measure of spike sharpness, $t_R$ is defined as the time spent by the substrate within 50° C. of $T_P$. Higher $T_P$ has the primary effect of causing increased activation, hence causing reduced $R_S$ and increased $I_{on}$. Different devices have different requirements of activation and hence different choices for $T_P$. For the same $T_P$, an increase in residence time has the primary effect of increasing diffusion, hence increasing the leakage currents. Thus, the main effort behind spike anneal is to reduce $t_R$ without compromising on the required level of activation.

Initial experiments on ramp up rates concluded that increasing ramp up rates greater than 180° C./second did not further improve the sheet resistance and junction depth profiles. Thus, there remains a need for reducing dopant diffusion during annealing of ultra shallow junctions while maintaining high dopant activation.

SUMMARY OF THE INVENTION

Significant and surprising improvement in reducing dopant diffusion in ultra shallow junctions was obtained, while maintaining high dopant activation, by providing a flow of a carrier gas into the processing chamber and maintaining gas pressure in the processing chamber below 900 Torr, heating the substrate to a peak temperature above 1000° C., and cooling the substrate at a rate sufficient to provide a residence time less than 1.6 seconds, wherein the residence time is defined as exposure of the substrate to a temperature within 50° C. of the peak temperature. In one embodiment, a residence time of 0.9 seconds was obtained for spike annealing of boron doped ultra shallow junctions in a silicon substrate resulting in greater than 10% reduction in boron diffusion.

BRIEF DESCRIPTION OF THE DRAWINGS

Additional objects and features of the invention will be more readily apparent from the following detailed description and appended claims when taken in conjunction with the drawings, in which:

DETAILED DESCRIPTION OF THE PREFERRED EMBODIMENT

The present invention demonstrates that spike annealing has been enhanced to meet the ultra-shallow junction requirements for the 100 nm-technology node and beyond. An improved spike profile results from hardware and process improvements to the standard Centura Radiance™ RTP chamber as discussed below. The residence time (a metric of spike sharpness) improved to less than 1.6 seconds. In one embodiment, a residence time of 0.9 seconds was achieved resulting in at least a 10% improvement in intrinsic diffusion for boron doped substrates. Intrinsic diffusion modeling suggests that this improvement will translate to nearly 35% improvement in diffusion of some dopants in ultra shallow junctions.

Different boron ion implant splits were used to characterize the change in the spike sharpness. Implant splits were optimized to reduce transient enhanced diffusion effects. These substrates were annealed at varying peak temperatures with both improved and non-improved CENTURA® Radiance™ chambers available from Applied Materials, Inc. A greater than 10% improvement in $R_s/X_j$ performance is observed with the improved chamber for the boron implanted substrates. Such an improvement could translate into greater than 7.5% improvement in $I_{dsat}$ in various semiconductor devices. These improvements in spike annealing did not have any detrimental effects on Uniformity. Tests comparing $R_S$ averages and Uniformity of the improved chamber with the standard Centura® Radiance spike showed no observable differences.

Figure 1:
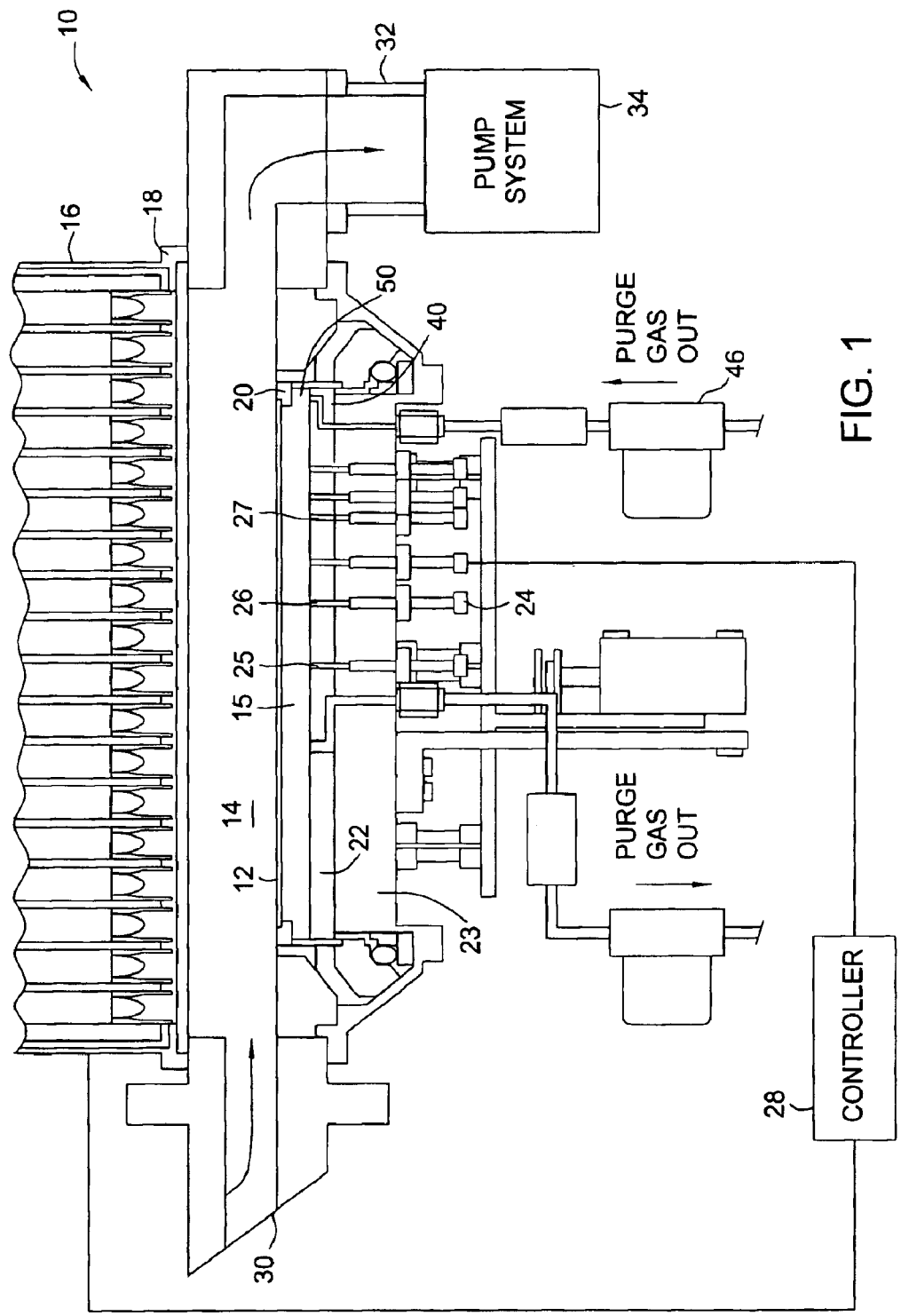
FIG. 1 is a diagrammatic view in vertical cross-section of a portion of an RTP system according to one embodiment of the present invention.

The spike annealing of the present invention can be performed in an RTP system capable of maintaining gas pressure in the annealing ambient at a level significantly lower than the atmospheric pressure. An example of such an RTP system is the RADIANCE CENTURA® system commercially available from Applied Materials, Inc., in Santa Clara, Calif. FIG. 1 illustrates an improved rapid thermal processing (RTP) system 10 including a processing chamber 14 for annealing a disk-shaped semiconductor substrate 12, according to one embodiment of the present invention. Chamber 14 is radiatively heated through a water-cooled quartz window 18 by a heating lamp assembly 16. The peripheral edge of substrate 12 is supported by a rotatable support structure 20, which can rotate at a rate of up to about 120 rpm (revolutions per minute). Beneath substrate 12 is a nickel-plated aluminum reflector plate assembly 22 that has an optically reflective coating facing the backside of substrate 12 to enhance the effective emissivity of substrate 12. The optically reflective coating is further described in related application Ser. No. 10/267,053, which description is incorporated by reference herein. Reflector plate assembly 22 is mounted on a water-cooled base 23. Cool down of substrates has been enhanced by increasing the cooling capacity of the water cooled base 23 and by locating the reflector plate assembly 22 closer to the water cooled base 23. Furthermore, the optical coating was enhanced to absorb radiated energy when the lamp assembly is off. Between the top surface of reflector plate assembly 22 and the backside of substrate 12 is a reflective cavity 15.

In a system designed for processing eight inch (200 mm) silicon wafers, reflector 22 has a diameter of about 8.9 inches, the separation between substrate 12 and the top surface of reflector 22 is about 5–10 mm, and the separation between substrate 12 and the bottom surface of quartz window assembly 18 is about 25 mm. In a system designed for processing twelve-inch (300 mm) silicon wafers, reflector 22 has a diameter of about 13 inches, the separation between substrate 12 and the top surface of reflector 22 is about 18 mm, and the separation between substrate 12 and the bottom surface of quartz window assembly 18 is about 30 mm.

The temperatures at localized regions of substrate 12 are measured by a plurality of temperature probes 24 that are positioned to measure substrate temperature at different radial locations across the substrate. Temperature probes 24 receive light from inside the processing chamber through optical ports 25, 26, 27, which extend through the top surface of reflector plate assembly 22. While processing system 10 typically may have a total of ten such temperature probes, only some of the probes are shown in FIG. 1. At the reflector plate surface, each optical port may have a diameter of about 0.08 inch. Sapphire light pipes deliver the light received by the optical ports to respective optical detectors (for example, pyrometers), which are used to determine the temperature at the localized regions of substrate 12. Temperature measurements from the optical detectors are received by a first controller 28 that controls the radiative output of heating lamp assembly 16. The resulting feedback loop improves the ability of the processing system to uniformly heat substrate 12.

During processing, gases for the annealing ambient are introduced into processing chamber 14 through an ambient gas input 30. The ambient gases flow across the top surface of substrate 12 and may react with a heated substrate. Excess ambient gases, as well as any reaction by-products, are withdrawn from processing chamber 14 through an ambient gas output 32 by a pump system 34.

Most of the excess ambient gases and reaction products can be pumped out of processing chamber 14, but some volatile contaminants, especially those with relatively high vapor pressures such as $BO_x$ and $PO_x$, may leak into reflective cavity 15 and deposit onto the optical components situated around the reflective cavity. The rate at which volatile contaminants are deposited onto these optical components can be substantially reduced by a flow of a purge gas across the top surface of reflective plate assembly 22. As described in commonly assigned U.S. Pat. No. 6,281,790 B1, which is incorporated herein by reference, a purge fluid injector 40 can be used to produce a substantially laminar flow of a purge gas across the top surface of reflector plate assembly 22.

Figure 2:
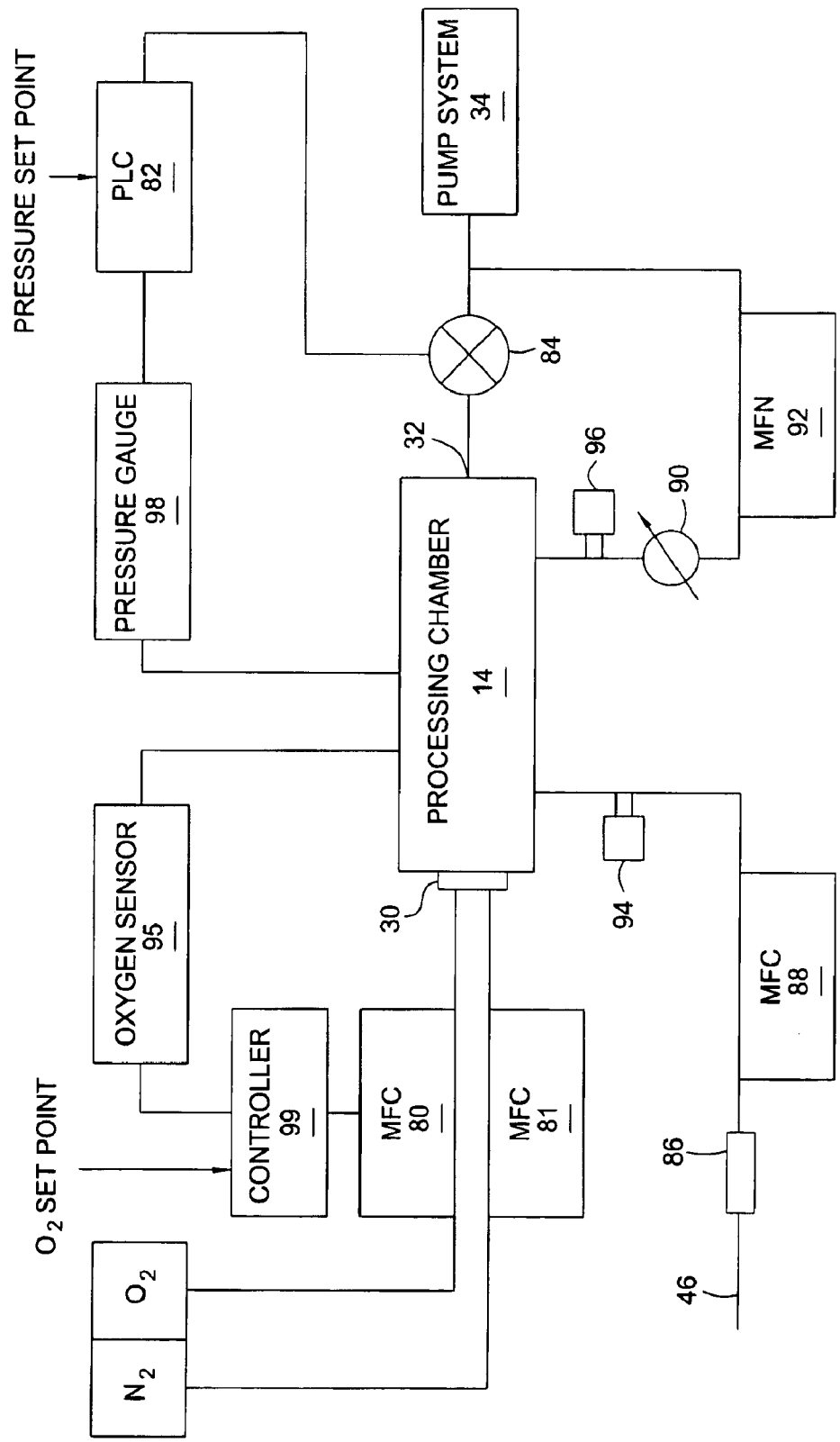
FIG. 2 is a block diagram of a fluid control system that dynamically monitors and controls gas composition and gas pressure in a processing chamber of the RTP system.

The composition of the ambient gases, the flow rate of the purge gas, and the gas pressure in processing chamber 14 are controlled by a fluid control system shown in FIG. 2. In one embodiment of the present invention, the ambient gases comprise oxygen ($O_2$) and a carrier gas, such as nitrogen ($N_2$). Mass flow controllers (MFC) 81 and 80 are used to regulate the flow of the carrier gas and oxygen, respectively, into processing chamber 14. A second feedback loop associated with processing chamber 14 controls the oxygen concentration in processing chamber. The second feedback loop includes the MFC 80, an oxygen sensor 95 coupled to the processing chamber 14 and configured to monitor the oxygen concentration in processing chamber, and a second controller 99 coupled between the oxygen sensor 95 and MFC 80, and configured to adjust the MFC based on an oxygen concentration set point ($O_2$ set point) and the oxygen concentration value detected by the oxygen sensor 95. The second feedback loop insures that a desired $O_2$ concentration is maintained in processing chamber 14, and may be used as part of a shut down mechanism associated with chamber 14 to prevent substrates from being processed in chamber 14 when the oxygen concentration cannot be regulated properly.

When a purge gas, such as nitrogen, is used to prevent deposition of volatile contaminants in the reflective cavity 15, the purge gas is introduced into processing chamber 14 through input 46 which is connected to a filter 86. An MFC 88 is used to regulate the flow of purge gas into processing chamber 14. An adjustable flow restrictor 90 and a mass flow meter (MFM) 92 are used to regulate the rate at which purge gas is removed from processing chamber 14. To reduce the migration of purge gas into the processing region of the processing chamber 14, which is above substrate 12, flow restrictor 90 is adjusted such that the rate at which purge gas is introduced into processing chamber 14 is substantially the same as the rate at which purge gas is removed from processing chamber 14. Solenoid shut-off valves 94 and 96 provide additional control over the flow of purge gas through processing chamber 14.

A third feedback loop associated with chamber 14 is a closed-loop pressure control system used to regulate the gas pressure in processing chamber 14 by controlling the rate at which gases are removed from processing chamber 14. Still referring to FIG. 2, in one embodiment of the present invention, the pressure control system comprises a pressure control valve 84 at ambient gas output 32, a pressure gauge 98 coupled to processing chamber 14, a programmable logic controller (PLC) 82 coupled to pressure gauge 98, and a third controller 97 coupled between PLC 82 and pressure control valve 84. During the operation of the processing chamber 14, the pressure gauge 98 measures the gas pressure in processing chamber 14 periodically and sends the measured pressure value to PLC 82. The PLC 82 subtracts the measured pressure value from a pressure set point, which indicates the intended gas pressure in chamber 14, and uses an algorithm, such as a proportional integral derivative (PID) control algorithm, to produce a control signal based on a set of tuning parameters. The control signal is then used by PLC 82 to adjust the amount of flow through pressure control valve 84.

In one embodiment of the present invention, processing chamber 14 is coupled to one or more transfer chambers (not shown), each through a load lock (not shown). The transfer chamber(s) and the associated load lock system facilitate transfers of substrates in and out of processing chamber 14 without substantially changing the gas pressure in processing chamber 14.

Figure 3:
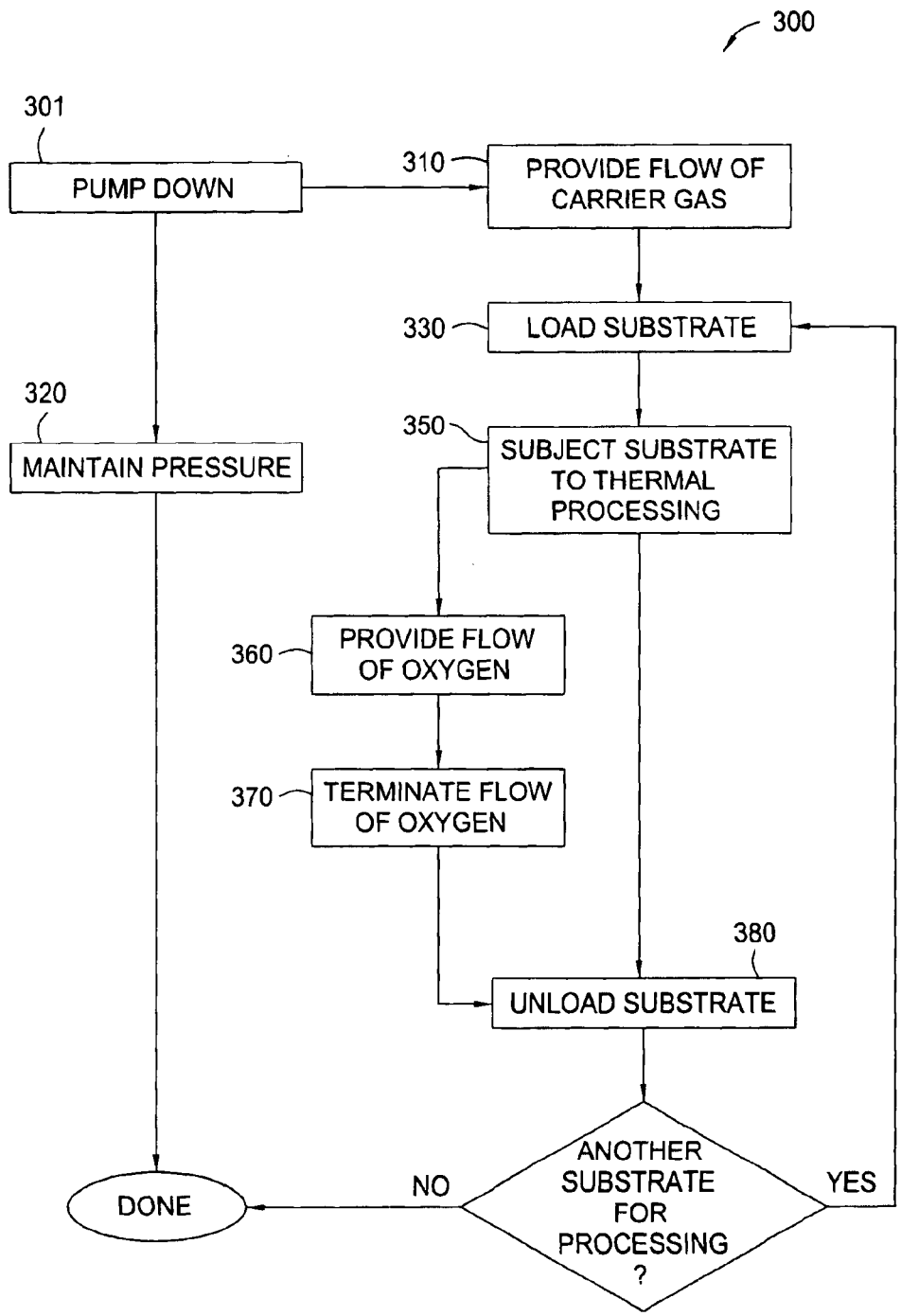
FIG. 3 is a flow diagram of a method for annealing a silicon substrate in the processing chamber of the RTP system.

A semiconductor substrate 12, after going through a dopant implant process, can be annealed in processing chamber 14 using a process 300, as illustrated in FIG. 3, according to one embodiment of the present invention. Referring to FIG. 3, before the substrate is loaded into the chamber, processing chamber 14 is pumped down at step 301 to a pressure level between 1 Torr and 900 Torr, preferably a pressure between about 5 Torr and about 300 Torr. Then, while the gas pressure in processing chamber 14 is maintained at step 320 at the pressure level, processing chamber 14 is purged at step 310 with a carrier gas, such as nitrogen, which is introduced into chamber 14 through MFC 81. Other suitable carrier gases include argon, krypton, and xenon. In one embodiment of the present invention, the gas pressure in processing chamber 14 is maintained at step 320 at a level that is in the range of about 5–100 Torr. The flow rate of the carrier gas during the purge step 310 is in the range of about 5–10 standard liter per minute (slm). The purging step reduces the oxygen concentration in processing chamber 14 to below a predetermined minimum value, such as 5 or 50 parts per million (ppm). The time the purging step 310 takes depends on the pressure in processing chamber 14. In one embodiment of the present invention, when the gas pressure in processing chamber 14 is maintained at 10 Torr, it takes less than a few seconds of purging for the oxygen concentration in processing chamber 14 to drop below 5 ppm. At 100 Torr, the purging step may take about 15 seconds, which is still about 4 times quicker than purging at atmospheric pressure, as in the conventional spike anneal process. Also, purging step 310 may not need to be performed for every substrate, as explained below.

Before or after the purging step 310, substrate 12 is loaded at step 330 into processing chamber 14 from the transfer chamber, which is maintained at near vacuum and is also purged of oxygen. If substrate 12 is loaded after the purging step, a stabilization step (not shown) may be needed to allow the chamber pressure to stabilize after the loading step 330. Once the chamber pressure is stabilized, while the carrier gas flow is maintained at a predetermined flow rate, such as 5 or 10 standard liters per minute (slm), the substrate is subjected to an improved thermal process at step 350, as described for FIG. 4 below.

During or shortly before the thermal process step 350, with the flow of the carrier gas continuing, oxygen is introduced at step 360 into processing chamber 14 at a pre-calibrated flow rate through MFC 80. The pre-calibrated oxygen flow rate may depend on the gas pressure in processing chamber 14, the flow rate of the carrier gas, and a predetermined oxygen concentration for the anneal ambient, as discussed above. The desired oxygen concentration for the anneal ambient depends on the type of dopants used, and the performance requirements of the devices being fabricated. A typical oxygen concentration in processing chamber 14 is in the range of 1500 to about 75,000 ppm, and more typically in the range of 10,000 to about 25,000 ppm. After oxygen is introduced into processing chamber 14, the flow rate of oxygen (or the MFC 80) is periodically adjusted by controller 99 based on readings from oxygen sensor 95 so that the predetermined oxygen concentration value is maintained in processing chamber when oxygen in processing chamber is desired. By maintaining the gas pressure in processing chamber 14 at or below 100 Torr, the time it takes for the second feedback loop to adjust the oxygen concentration to the desired value, after a sufficient drift from that value is detected, should be less than a second. This allows accurate and dynamic control of the ambient gas composition during thermal process step 350. The oxygen flow may be turned off at step 370 before the substrate is unloaded at step 380 from processing chamber 14, so as to prevent the oxygen from leaking into the transfer chamber(s).

Also, with the fast response provided by the low chamber gas pressure, oxygen in chamber 14 can be introduced into processing chamber 14 during a processing phase when a certain level of oxygen concentration in the annealing ambient is desired and can be turned off or down during a processing phase when oxygen is not desired. In one embodiment of the present invention, oxygen is introduced into processing chamber 14 throughout thermal process step 350. In an alternative embodiment of the present invention, oxygen is introduced into processing chamber 14 only during certain phases of the thermal process step 350. For example, oxygen may be introduced at step 360 into processing chamber near the time when the fast-ramp phase 430 starts and during the soak time (if there is any) in thermal process step 350. Near the time when the substrate starts to cool down, the oxygen flow may be terminated at step 370 either by turning off the MFC 80 or by changing the $O_2$ set point to zero, allowing the oxygen concentration in the chamber to drop. At sufficiently low pressure, such as 5–20 Torr, the oxygen concentration may drop below the predetermined minimum value before the end of the thermal process step 350.

Figure 4:
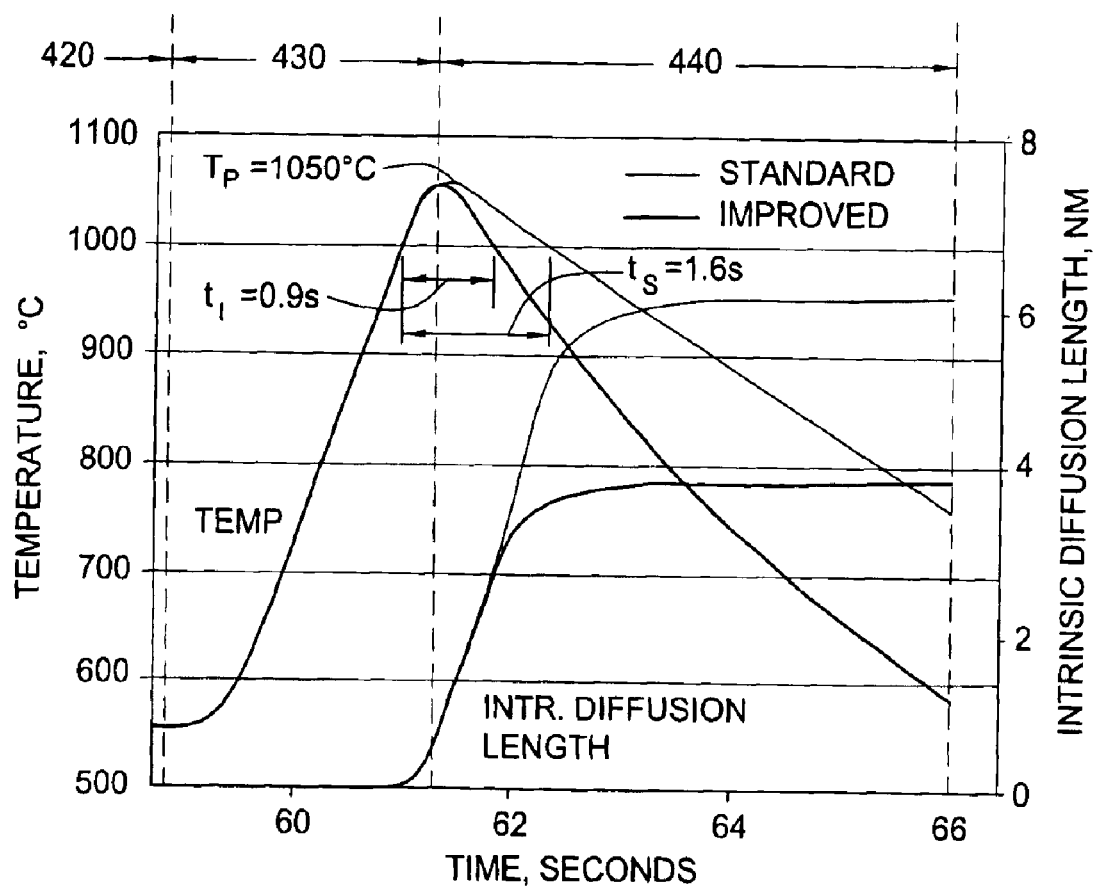
FIG. 4 is a chart of a heating schedule according to one embodiment of the present invention shown in comparison to a heating schedule shown in a related application.

A spike annealing process (for $T_P=1050°$ C.) on the non-improved CENTURA® Radiance™ chamber yields a standard residence time of $t_S=1.6$ seconds, as shown in FIG. 4. Also shown in FIG. 4 is the improved spike profile that resulted from the hardware and process improvements on the CENTURA® Radiance™ chamber discussed above. The improved spike profile increased the spike sharpness by ~40% to provide an improved residence time of $t_I=0.9$ seconds. Intrinsic diffusion modeling was also used to quantify the improvements in spike sharpness. An improvement of >35% was observed with the "improved spike" profile.

Referring to FIG. 4, the improved heating schedule of the thermal process step 350 (FIG. 3) shows changes in substrate temperature after a stabilization phase 420, a fast-ramp phase 430, and a cool-down phase 440. During the slow-ramp phase, the substrate is heated slowly and uniformly using open-loop heating to an initial temperature of about 500–600° C. Then the substrate is stabilized at the initial temperature during the stabilization phase 420. Subsequently, during the fast ramp-up phase 430, the substrate is heated again using closed-loop heating so that the substrate temperature rises at a rate of about 50–400° C. per second, preferably at least 180° C. per second, to a peak temperature of about 1000–1100° C. The substrate may be soaked at the peak temperature for a short period of time (<1 second), and is then cooled down during the cool-down phase 440 so that the substrate temperature drops at a rate of about 50–400° C. per second, preferably 90° C. per second. At the end of thermal process 350, substrate 12 is unloaded at step 380 from processing chamber 14 and another substrate is loaded at step 330 into processing chamber 14 (if more substrates are to be processed).

The exact order of some of the steps in the process 300 and/or the operation of the processing chamber 14 as described above can be altered. In addition, steps may be added or omitted and process parameters varied depending upon the requirements of a particular processing application and the particular RTP system in which the annealing process takes place. The above operations and the order in which they are presented are chosen for illustrative purposes and to provide a picture of a complete run sequence.

EXAMPLES

All comparison experiments were performed on B-ion implanted substrates that were pre-amorphised with Ge to reduce deep implants depths and enhance comparison of implant depths.

B-ion implants were performed using an Applied Materials Quantum™ LEAP implanter. Silicon substrates were pre-amorphised (PAI) with Ge, prior to the B implantation. The Ge pre-amorphisation was optimized for each B implant condition. The B implant energy ranged from 200 to 500 eV, and the implanted dose ranged from $10^{15}$ to $2\times10^{15}$ atoms/$cm^2$. The initial set of experiments also included 1 keV boron without PAI (dose=$10^{15}$ atoms/$cm^2$). All boron implants were performed in "decelerated" mode: B ions were extracted at 2 keV and decelerated to the desired final energy level. These substrates were then annealed with varying peak temperatures, using the improved spike profile of FIG. 4. The annealed substrates were measured for sheet resistance and analyzed for junction depth by characterizing boron profiles in silicon through dynamic Secondary Ion Mass Spectroscopy (SIMS) analysis.

A specific implant condition (Boron, 500 eV/$10^{15}$ atoms/$cm^2$, with Ge PAI) was also studied for its susceptibility to diffuse at lower temperatures. A spike anneal was performed on these substrates at $T_P<1000°$ C. Subsequently these substrates were analyzed for sheet resistance and junction depth.

Low spike peak temperature ($T_P$) experiments with 500 eV, $10^{15}$ atoms/$cm^2$ B-implanted substrates with Ge-PAI showed little or no significant diffusion. The observed activation was also very low (high $R_S$). Since there is no appreciable diffusion/activation at low temperatures, it can be concluded that for these particular implant conditions, diffusion occurs only at high temperatures. For the above Boron implanted substrates, it is unlikely to perceive any change in improving spike profiles at $T_P<1000°$ C.

Remaining substrates were annealed with the standard $t_S$-spike of 1.6 seconds and the improved $t_I$-spike of 0.9 seconds, using a wide range of spike peak temperatures from 1000° C. to 1100° C. An improvement of greater than 10% was attained by using the improved $t_I$-spike profile over the standard $t_S$-spike. Also, the improved spike profile compares favorably with available data on spike anneal processes using other RTP technologies.

Experiments were conducted with the improved spike profile to understand the impact on the temperature uniformity across the substrate. This was done by comparing the uniformity using the improved spike profile with the uniformity using the standard spike profile. No difference in Uniformity between the standard spike and improved spike was observed. Thus, the given improvements in spike annealing did not impact temperature uniformity across the substrate.

While the foregoing is directed to embodiments of the present invention, other and further embodiments of the invention may be devised without departing from the basic scope thereof, and the scope thereof is determined by the claims that follow.

What is claimed is:

1. A method for activating an implanted dopant in a semiconductor substrate in a processing chamber to form shallow junctions, the method comprising:

implanting a dopant in a semiconductor substrate; and activating the implanted dopant in a processing chamber to form shallow junctions by;

providing a flow of a carrier gas into the processing chamber and maintaining gas pressure in the processing chamber in the range of 5–100 Torr;

heating the substrate to a peak temperature above 1000° C.; and cooling the substrate at a rate sufficient to provide a residence time less than 1.6 seconds, wherein the residence time is defined as exposure of the substrate to a temperature within 50° C. of the peak temperature.

2. The method of claim 1, wherein the peak temperature is 1050° C.

3. The method of claim 1, wherein the implanted dopant is boron.

4. The method of claim 1, wherein the substrate is heated at a rate of at least 180° C./second.

5. The method of claim 1, wherein the residence time is at most 0.9 seconds.

6. The method of claim 1, wherein the substrate is cooled at a rate of 90° C./second.

7. A method for activating implanted boron in a semiconductor substrate in a processing chamber to form shallow junctions, the method comprising:

implanting a dopant in a semiconductor substrate; and activating the implanted dopant in a processing chamber to form shallow junctions by;

providing a flow of a carrier gas into the processing chamber and maintaining gas pressure in the processing chamber below about 300 Torr;

heating the substrate at a rate of at least 180° C./second to a peak temperature above 1000° C.; and cooling the substrate at a rate sufficient to provide a residence time of at most 0.9 seconds, wherein the residence time is defined as exposure of the substrate to a temperature within 50° C. of the peak temperature.

8. The method of claim 7, wherein the peak temperature is 1050° C.

9. The method of claim 8, wherein the carrier gas is mixed with oxygen and the gas pressure in the chamber is in the range of 5–100 Torr.

10. The method of claim 9, wherein the oxygen reaches a level in the range of 10000–15000 ppm before the substrate reaches the peak temperature.

11. The method of claim 10, wherein the substrate is cooled at a rate of 90° C./second.

12. The method of claim 11, wherein the substrate is heated at a rate of 250° C./second.

* * * * *

UNITED STATES PATENT AND TRADEMARK OFFICE
CERTIFICATE OF CORRECTION

PATENT NO. : 6,897,131 B2  Page 1 of 1
APPLICATION NO. : 10/668682
DATED : May 24, 2005
INVENTOR(S) : Balasubramanian Ramachandran et al.

It is certified that error appears in the above-identified patent and that said Letters Patent is hereby corrected as shown below:

<u>In the Specification</u>

Column 2, Line 3: Change "$R^s$" to --$R_s$--

<u>In the Claims</u>

Column 8, Claim 1, Line 54: Change the semicolon after "by" to a colon

Column 9, Claim 7, Line 12: Change the semicolon after "by" to a colon

Signed and Sealed this

First Day of August, 2006

JON W. DUDAS
*Director of the United States Patent and Trademark Office*